(12) United States Patent
Cho et al.

(10) Patent No.: US 6,448,166 B2
(45) Date of Patent: Sep. 10, 2002

(54) METHOD FOR FORMING A GATE FOR SEMICONDUCTOR DEVICES

(75) Inventors: Heung Jae Cho, Kyoungki-do (KR); Dae Gyu Park, Kyoungki-do (KR); Kwan Yong Lim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/895,268

(22) Filed: Jul. 2, 2001

(30) Foreign Application Priority Data

Jun. 30, 2000 (KR) ......................... 2000-37137

(51) Int. Cl.$^7$ ................. H01L 21/3205; H01L 21/4763
(52) U.S. Cl. ......................... 438/585; 438/151
(58) Field of Search ................. 438/151, 216, 438/261, 287, 585, 586, 591, 683, 684, 685, 648, 649, 786, 785

(56) References Cited

U.S. PATENT DOCUMENTS 6,156,600 A * 12/2000 Chao et al. ............... 438/238
6,171,900 B1 * 1/2001 Sun ............................ 438/240
6,287,910 B2 * 9/2001 Lee et al. .................. 438/240
6,303,481 B2 * 10/2001 Park ........................... 438/591

* cited by examiner

Primary Examiner—Viet Q. Nguyen
Assistant Examiner—David Nhu
(74) Attorney, Agent, or Firm—Pillsbury Winthrop LLP

(57) ABSTRACT

The present invention discloses a method for forming a gate for semiconductor devices by depositing a $TaO_xN_y$ film as a gate oxide film. The method includes the steps of providing a semiconductor substrate where a device isolation film has been formed, growing an $SiO_2$ or SiON film on the semiconductor substrate, depositing an amorphous $TaO_xN_y$ film on the $SiO_2$ or SiON film, performing a low temperature annealing process to improve quality of the amorphous $TaO_xN_y$ film, performing a high temperature annealing process ex-situ to remove organic substances and nitrogen in the amorphous $TaO_xN_y$ film, and crystallize the amorphous $TaO_xN_y$ film, and depositing a metal barrier film on the crystallized $TaO_xN_y$ film, and depositing a polysilicon film or metal film for a gate electrode on the metal barrier film.

20 Claims, 6 Drawing Sheets

(a) as-deposited (b) after improvement anneal (a)Ta$_2$O$_5$ (b)TaO$_x$N$_y$ (a)Ta$_2$O$_5$ (b)TaO$_x$N$_y$

METHOD FOR FORMING A GATE FOR SEMICONDUCTOR DEVICES

BACKGROUND OF THE INVENTION

1. Field of the Invention

The present invention relates to a method for forming a gate for semiconductor devices, and in particular to an improved method for forming a gate for semiconductor devices by using a $TaO_xN_y$ film as a gate oxide film.

2. Description of the Background Art

In general, in highly integrated semiconductor devices, a gate oxide film of a device having line widths of 0.1 μm or less has an effective oxide thickness of below about 40 Å in order to reduce in short channel effects and to provide efficient control of channels. However, such a thin gate oxide film increases the leakage current due to a direct tunneling, which causes deterioration in the transistor properties and a refresh time relating to the resultant capacitor.

Accordingly, in a conventional art, a $Ta_2O_5$ film, which is a metal oxide film having a high dielectric constant, is used as the gate oxide film of the transistor, rather than the conventional $SiO_2$ film.

FIG. 1A illustrates a conventional method for forming a gate for semiconductor devices. As shown in FIG. 1A, a $SiO_2$ or SiON film 2 is formed on a semiconductor substrate where a device isolation film (not shown) has been formed.

A $Ta_2O_5$ film 3 having a high dielectric constant is formed on the $SiO_2$ or SiON film 2 by a chemical vapor deposition (CVD). Here, the $Ta_2O_5$ film 3 is a metal oxide film having a high dielectric constant. The $Ta_2O_5$ film 3 is formed by using $Ta(C_2H_5O)_5$ as a raw material and $O_2$ or $N_2O$ as a reaction gas.

Thereafter, a TiN film or WN film 4 is deposited on the $Ta_2O_5$ film 3 to form a metal barrier, and a conductive polysilicon film or metal film 5 is deposited thereon as the gate electrode material.

Although not illustrated, a subsequent process for forming the transistor is performed according to a known method.

However, when the metal gate electrode is employed on the $Ta_2O_5$ film, as shown in FIG. 1B, a threshold voltage is over +1V due to a work function of the metal gate.

In order to reduce the threshold voltage, phosphorus is used in a channel ion implantation process, instead of boron. When phosphorus is ionimplanted, a buried channel is formed in an NMOS transistor, not a surface channel.

In addition, containments comprising carbon atoms, carbon compounds and $H_2O$ exist in the $Ta_2O_5$ film formed by the reaction of $Ta(C_2H_5O)_5$ and $O_2$ or $N_2O$, which increases the leakage current of the gate and degrades the dielectric properties.

Therefore, in order to prevent an increased leakage current level and degraded the dielectric properties, the conventional method requires an additional oxidation process for stabilizing the unstable stoichiometry by oxidizing vacancy Ta atoms in the $Ta_2O_5$ film, and also typically requires two or three high and/or low temperature annealing processes after the deposition.

SUMMARY OF THE INVENTION

Accordingly, an object of the present invention is to provide a method for forming a gate for semiconductor devices which can prevent a leakage current by using a TaON film having a stable stoichiometry as a gate oxide film.

In order to achieve the above-described object of the present invention, there is provided a method for forming a gate for semiconductor devices, including the steps of: providing a semiconductor substrate where a device isolation film has been formed; depositing an $SiO_2$ or SiON film on the semiconductor substrate; depositing an amorphous $TaO_xN_y$ film on the $SiO_2$ or SiON film; performing a low temperature annealing process to improve quality of the amorphous $TaO_xO_y$ film; performing a high temperature annealing process in ex-situ to remove organic substances and nitrogen in the amorphous $TaO_xN_y$ film, and crystallize the amorphous $TaO_xO_y$ film; and depositing a metal barrier film on the crystallized $TaO_xN_y$ film, and depositing a polysilicon film or metal film for a gate electrode on the metal barrier film.

In addition, there is provided a method for forming a gate for semiconductor devices, including the steps of: providing a semiconductor substrate where a device isolation film has been formed; growing an $SiO_2$ or SiON film on the semiconductor substrate; forming an amorphous $TaO_xN_y$ film on the $SiO_2$ or SiON film; performing a low temperature annealing process on the amorphous $TaO_xN_y$ film by using plasma or UV; removing oxygen vacancies and organic substances in the amorphous $TaO_xO_y$ film; crystallizing the amorphous $TaO_xN_y$ film by performing a high temperature annealing process, such as a rapid thermal process (RTP); and forming a metal barrier film on the crystallized $TaO_xN_y$ film, and forming a polysilicon film or metal film for a gate electrode on the metal barrier film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a gate for semiconductor devices in accordance with the present invention will now be described with reference to the accompanying drawings.

Figure 1A:
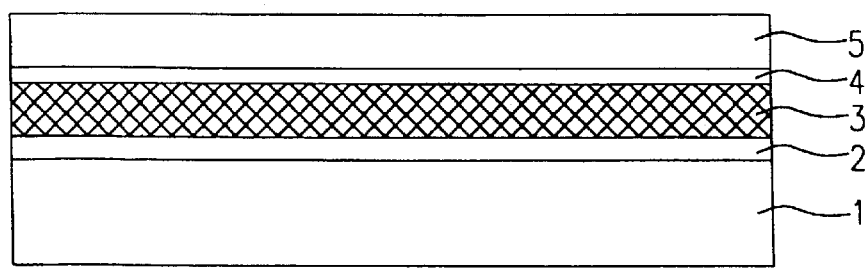
FIG. 1A illustrates a conventional method for forming a gate for semiconductor devices.
Figure 1B:
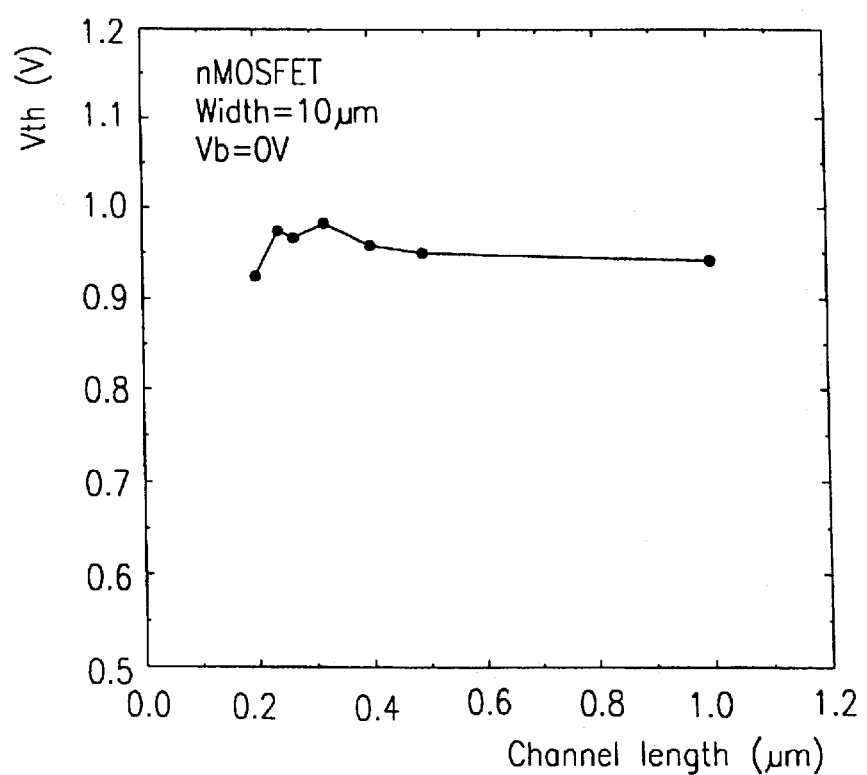
FIG. 1B shows the threshold voltage due to a work function of the metal gate formed according to a conventional method.
Figure 2A:
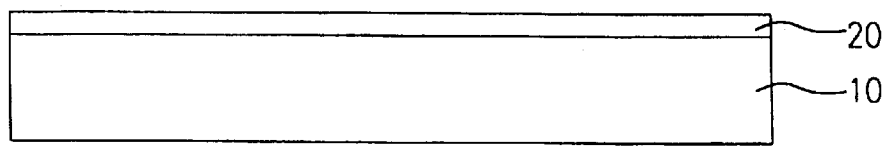
FIGS. 2A through C illustrate sequential steps of a method for forming a gate for semiconductor devices in accordance with the present invention.

As illustrated in FIG. 2A, there is provided a semiconductor substrate 10 where a device isolation film (not shown) has been formed.

In order to improve an interface property, an RTP (rapid thermal process) is performed at a temperature between about 700° C. and 1100° C. in an atmosphere of $O_2$ or $N_2O$ gas. Preferably, a $SiO_2$ or SiON film is deposited with a thickness of 15 Å. Especially, the SiON film restricts oxidation of the semiconductor substrate 10 in a subsequent annealing process of an $O_2$ atmosphere.

Figure 2B:
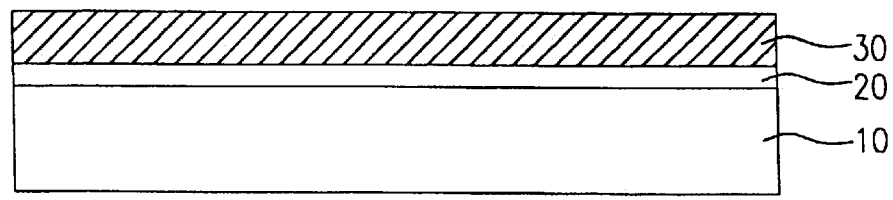

As shown in FIG. 2b, an amorphous $TaO_xO_y$ film 30 is formed on the $SiO_2$ or SiON film. Here, the amorphous $TaO_xN_y$ film 30 is deposited at a temperature between about 300° C. and 500° C. according to an MOCVD (metal organic chemical vapor deposition) using $Ta(C_2H_5O)_5$ and $NH_3$. Preferably, the amorphous $TaO_xO_y$ film 30 is deposited with a thickness of about 20 to 500 Å.

Figure 2C:
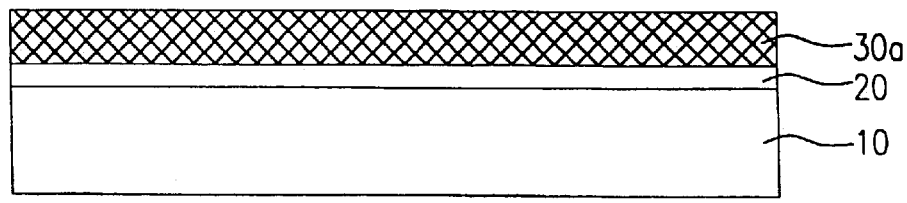

As depicted in FIG. 2C, in order to supply oxygen to oxygen vacancies in the $TaO_xO_y$ film and remove organic substances and nitrogen, a low temperature annealing process is performed at a temperature between about 300° C. and 500° C. by applying about 100 W power, supplying a $N_2O$ gas in a chamber to form a plasma.

In addition, the low temperature annealing process is performed at about 300° C. and 500° C. for about 10 to 30 minutes, by using UV and exciting $O_2$ or $O_3$. Moreover, the amorphous $TaO_xN_y$ film is deposited at a thickness of about 20 to 150 Å on the amorphous $TaO_xN_y$ film where the low temperature annealing process has been carried out. Thereafter, an annealing process is performed by exciting a $N_2O$ gas in a chamber, using plasma or exciting $O_2$ or $O_3$ using UV thereby removing the oxygen vacancies and organic substances in the $TaO_xO_y$ film.

A high temperature annealing process is performed on the amorphous $TaO_xO_y$ film ex-situ to remove the organic substances and nitrogen, thereby forming a crystallized $TaO_xN_y$ film 30a. At this time, the high temperature annealing process is performed ex-situ at about 700° C. and 1000° C. for about 60 seconds in an atmosphere of $N_2O$ or $O_2$ by the rapid thermal process (RTP), or in a furnace in an oxidizing atmosphere.

Figure 2D:
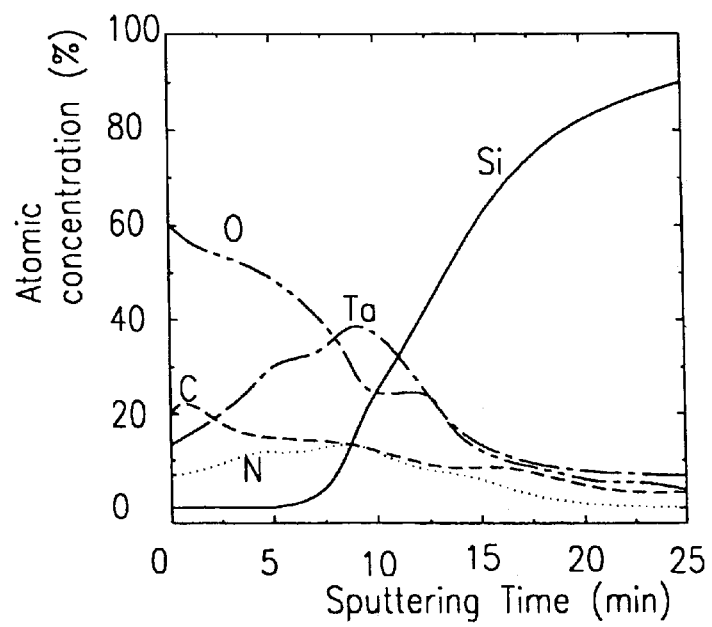
FIG. 2D illustrates a surface analysis before and after annealing a $TaO_xN_y$ film for a gate oxide film.
Figure 2D:
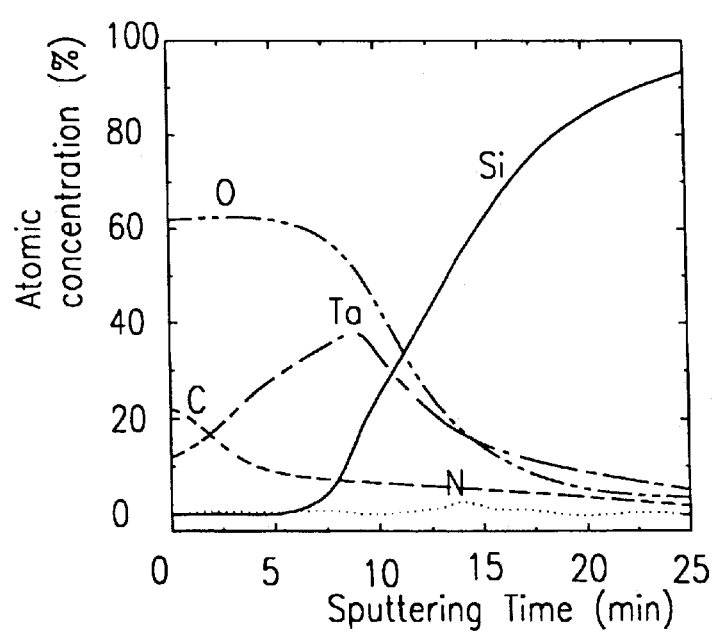

FIG. 2D shows an Auger electron spectroscopy data. As shown in FIG. 2D(a), nitrogen exists in the $TaO_xN_y$ films. As depicted in FIG. 2D(b), a small amount of nitrogen exists in the $Si/SiO_2$ film interface, after performing the low temperature annealing process for improving the $TaO_xN_y$ film.

Figure 2E:
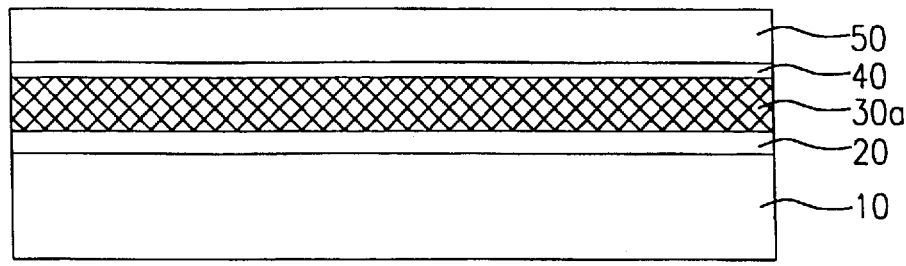
FIG. 2E illustrates the method for forming the gate for semiconductor devices in accordance with the present invention.

As illustrated in FIG. 2E, a metal barrier film 40 is formed on the crystallized $TaO_xN_y$ film 30a. Preferably, the metal barrier film 40 consists of a TiN or WN film.

Thereafter, a polysilicon film or metal film 50 for a gate electrode is formed on the metal barrier film 40. Preferably, the metal film for the gate electrode consists of a $TiSi_2$, $WSi_x$ or W film.

Although not illustrated, the gate is formed according in a known manner, followed by a process for forming the transistor.

Figure 3A:
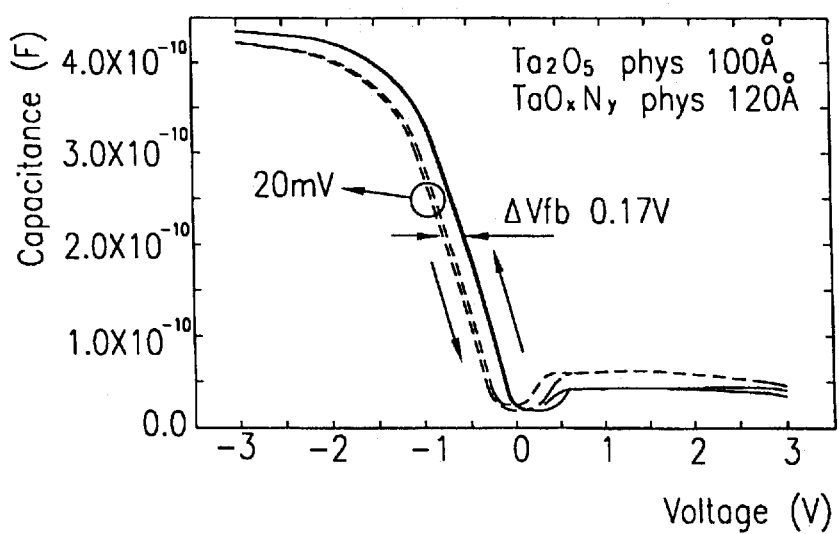
FIGS. 3A through 3C illustrate comparisons between $Ta_2O_5$ and $TaO_xO_y$ films.

FIG. 3A shows C–V plot between a general $Ta_2O_5$ film and the $TaO_xN_y$ film. As shown in FIG. 3A, the $TaO_xN_y$ film moves in a flat band voltage ($V_{fb}$) more than the $Ta_2O_5$ film by 0.17V in a negative direction. Such a variation of the $V_{fb}$ results from positive charges by nitrogen. As a result, when the transistor is formed, a threshold voltage can be reduced by 0.17V FIGS. 3B and 3C illustrate an effective oxide thickness ($T_{eff}$) and a breakdown voltage (BV) in a 64M cell region before and after performing a selective oxidation process on the whole region, except for the metal gate to prevent a damage in the transistor formation process.

Figure 3B:
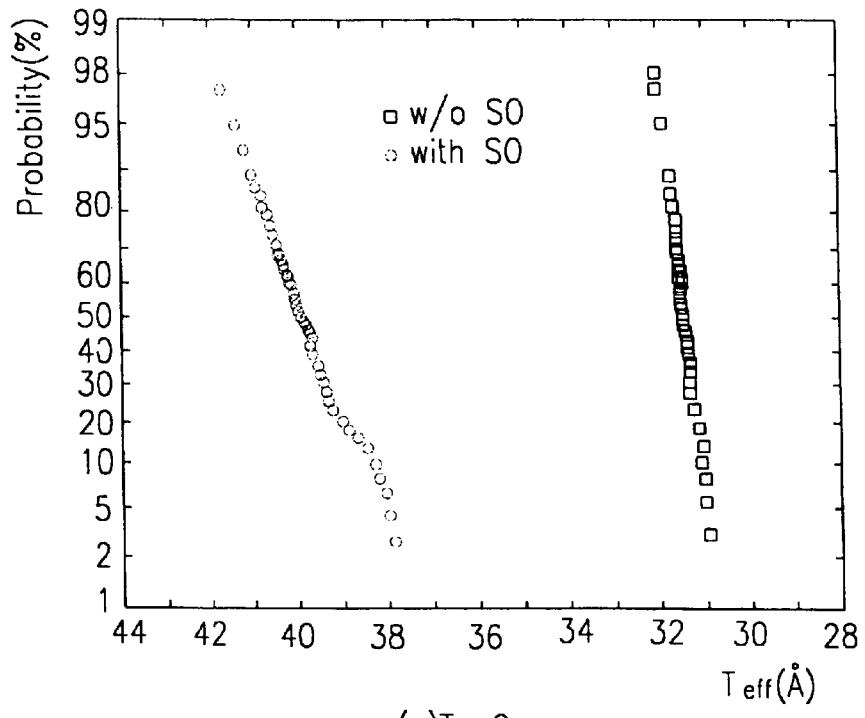
Figure 3B:
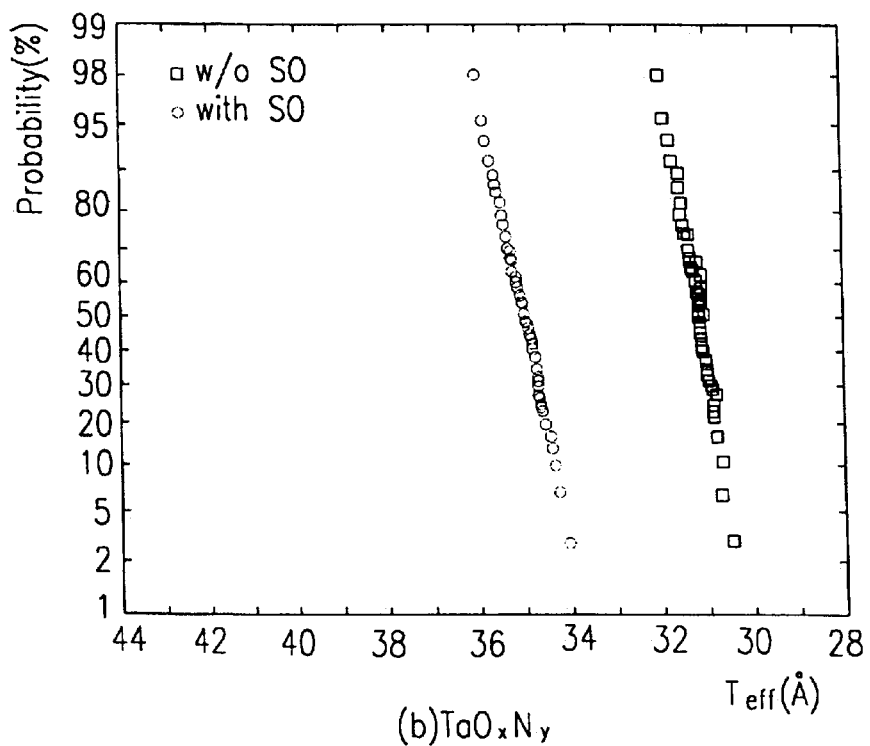
Figure 3C:
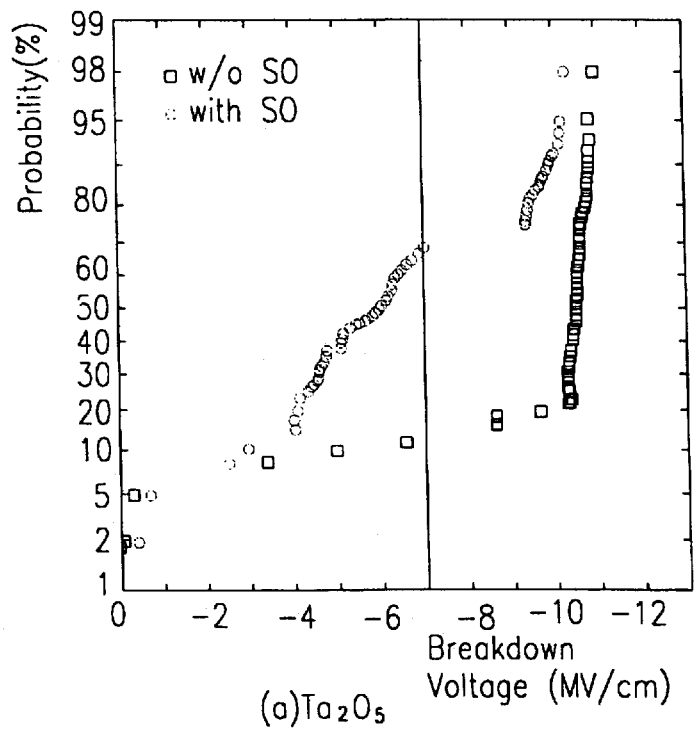
Figure 3C:
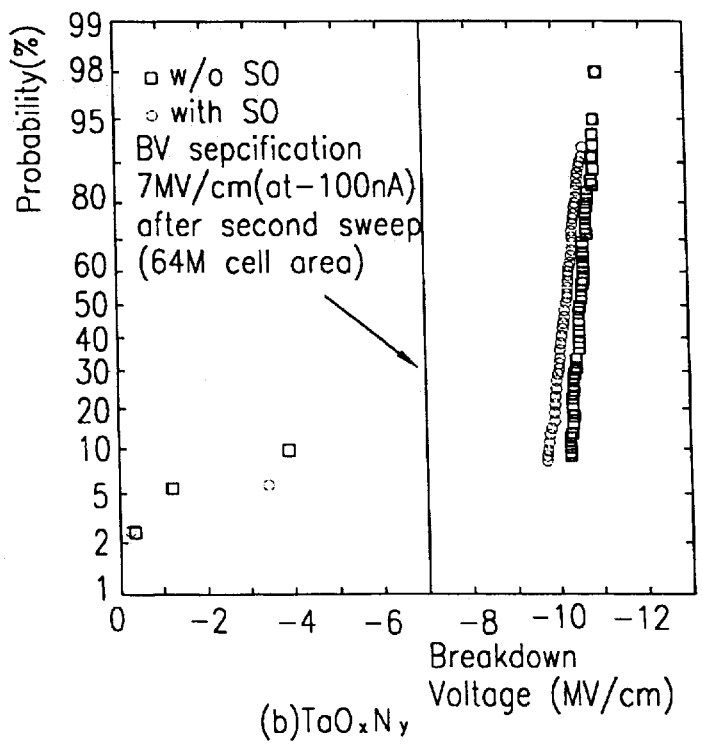

As shown in FIGS. 3B and 3C, the effective oxide thickness of the $TaO_xN_y$ film is increased less than the $Ta_2O_5$ film. In addition, in the respect of the breakdown voltage, the $TaO_xO_y$ film does not vary remarkably before/after the selective oxidation process. Accordingly, when the $TaO_xO_y$ film is used as the gate oxide film, a margin of the subsequent process is increased.

As discussed earlier, the present invention employs the $TaO_xO_y$ film as the gate oxide film, thereby easily adjusting the threshold voltage, increasing resistance to the subsequent annealing process and oxidation, improving reliability of an insulation film as well as increasing a margin in the subsequent process.

Moreover, the $TaO_xO_y$ film has a higher dielectric constant than the $SiO_2$ film, and a more stabilized chemical composition structure than the $Ta_2O_5$ film. Therefore, the $TaO_xO_y$ film has little oxidation reactivity with the gate electrode. In addition, the $TaO_xO_y$ film consists of a stabilized Ta—O—N structure. As a result, the $TaO_xO_y$ film is resistant to an external electric impact and prevents the leakage current.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming a gate for semiconductor devices, comprising the steps of:

provding a semiconductor substrate;

forming one of a $SiO_2$ film and a SiON film on the semiconductor substrate;

forming an amorphous $TaO_xN_y$ film on the one of the $SiO_2$ and SiON films;

performing a low temperature annealing process on the amorphous $TaO_xN_y$ film;

crystallizing the amorphous $TaO_xN_y$ film by performing a high temperature annealing process; and forming one of a polysilicon film and a metal film on the crystallized $TaO_xN_y$ film.

2. The method according to claim 1, wherein the one of the $SiO_2$ film and the SiON film is formed by performing a rapid thermal process at a temperature between about 700° C. and 1100° C. in an atmosphere of one of $O_2$ gas and $N_2O$ gas.

3. The method according to claim 1, wherein the deposited one of the $SiO_2$ film and the SiON film has a thickness of below about 15 Å.

4. The method according to claim 1, wherein the amorphous $TaO_xN_y$ film is deposited at a temperature between about 300° C. and 500° C. by a metal organic chemical vapor deposition using $Ta(C_2H_5O)_5$ and $NH_3$.

5. The method according to claim 1, wherein the deposited amorphous $TaO_xN_y$ film has a thickness between about 20 Å and 500 Å.

6. The method according to claim 1, wherein the low temperature annealing process is performed at a temperature between about 300° C. and 500° C. by applying about 100 W power, exciting an $N_2O$ gas in a chamber using plasma.

7. The method according to claim 1, wherein the low temperature annealing process is performed by exciting $O_2$ or $O_3$ at a temperature between about 300° C. and 500° C. for about 10 to 30 minutes using UV.

8. The method according to claim 1, further comprising a step for removing oxygen vacancies and organic substances in the $TaO_xN_y$ film, by depositing a second amorphous $TaO_xN_y$ film having a thickness of about 20 Å to 150 Å on the amorphous $TaO_xN_y$ film where the low temperature annealing process has been carried out, and by performing second annealing process by exciting an $N_2O$ gas in a chamber using plasma or by exciting $O_2$ or $O_3$ using UV.

9. The method according to claim 1, wherein the high temperature annealing process is performed ex-situ at a temperature between about 700° C. and 1000° C. for about 60 seconds in an atmosphere of one of $N_2O$ and $O_2$ by a rapid thermal process.

10. The method according to claim 1, wherein the high temperature annealing process is performed ex-situ at a temperature between about 700° C. and 1000° C. for about 60 seconds in an atmosphere of one of $N_2O$ and $O_2$ in a furnace of an oxidizing atmosphere.

11. The method according to claim 1, wherein the metal film is one of a $TiSi_2$ film, a $WSi_x$ film and a W film.

12. A method for forming a gate for semiconductor devices, comprising the steps of:

providing a semiconductor substrate;

forming one of a $SiO_2$ film and a SiON film on the semiconductor substrate;

forming an amorphous $TaO_xN_y$ film on the one of the $SiO_2$ film and the SiON film;

performing a low temperature annealing process on the amorphous $TaO_xN_y$ film by using plasma or UV;

removing oxygen vacancies and organic substances in the amorphous $TaO_xN_y$ film;

crystallizing the amorphous $TaO_xN_y$ film by performing a high temperature annealing process;

forming a metal barrier film on the crystallized $TaO_xN_y$ film; and forming one of a polysilicon film and a metal film on the metal barrier film.

13. The method according to claim 12, wherein the deposited one of the $SiO_2$ film and the SiON film has a thickness of below about 15 Å.

14. The method according to claim 12, wherein the deposited amorphous $TaO_xN_y$ film has a thickness between about 20 Å and 500 Å and is deposited at a temperature between about 300° C. and 500° C. by a metal organic chemical vapor deposition using $Ta(C_2H_5O)_5$ and $NH_3$.

15. The method according to claim 12, wherein the low temperature annealing process is performed at one of:

a temperature between about 300° C. and 500° C. by applying about 100 W power, exciting an $N_2O$ gas in a chamber, and using plasma; and a temperature between about 300° C. and 500° C. for about 10 to 30 minutes exciting one of $O_2$ or $O_3$ by using UV.

16. The method according to claim 12, wherein the high temperature annealing process is performed ex-situ at a temperature between about 700° C. and about 1000° C. for about 60 seconds in an atmosphere of one of $N_2O$ and $O_2$ by a rapid thermal process and a furnace of an oxidizing atmosphere.

17. The method according to claim 12, wherein the metal barrier film is one of a TiN film and a WN film.

18. The method according to claim 12, wherein the metal film is elected from one of a $TiSi_2$ film, a $WSi_x$ film and a W film.

19. A method for forming a gate for semiconductor devices, comprising the steps of:

providing a semiconductor substrate;

forming one of a $SiO_2$ film and a SiON film on the semiconductor substrate;

forming an amorphous $TaO_xN_y$ film on the one of the $SiO_2$ and SiON films;

performing a low temperature annealing process on the amorphous $TaO_xN_y$ film;

crystallizing the amorphous $TaO_xN_y$ film by performing a high temperature annealing process; and forming a metal barrier film on the crystallized $TaO_xN_y$ film; and forming one of a polysilicon film and a metal film on the metal barrier film.

20. The method according to claim 19, wherein the metal barrier film is one of a TiN film and a WN film.

* * * * *